US011965493B2

(12) United States Patent
Zhou et al.

(10) Patent No.: US 11,965,493 B2
(45) Date of Patent: Apr. 23, 2024

(54) ADJUSTABLE DEFORMING COMPOSITE STRUCTURE BASED ON HYDROGEN-INDUCED EXPANSION EFFECT AND PREPARATION METHOD THEREFOR

(71) Applicant: CENTRAL SOUTH UNIVERSITY, Changsha (CN)

(72) Inventors: Chengshang Zhou, Changsha (CN); Yong Liu, Changsha (CN); Zhongyuan Duan, Changsha (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 150 days.

(21) Appl. No.: 17/622,820

(22) PCT Filed: Dec. 8, 2020

(86) PCT No.: PCT/CN2020/134640
§ 371 (c)(1),
(2) Date: Dec. 26, 2021

(87) PCT Pub. No.: WO2021/115281
PCT Pub. Date: Jun. 17, 2021

(65) Prior Publication Data
US 2022/0325703 A1 Oct. 13, 2022

(30) Foreign Application Priority Data

Dec. 13, 2019 (CN) .......................... 201911282262.0

(51) Int. Cl.
*B32B 15/01* (2006.01)
*F03G 7/06* (2006.01)
*B33Y 80/00* (2015.01)
(52) U.S. Cl.
CPC ............ *F03G 7/0616* (2021.08); *B32B 15/01* (2013.01); *B32B 15/013* (2013.01);
(Continued)

(58) Field of Classification Search
None
See application file for complete search history.

(56) References Cited

U.S. PATENT DOCUMENTS

| 4,637,962 A | 1/1987 | Albrecht et al. |
| 2001/0005556 A1 | 6/2001 | Kobayashi et al. |
| 2017/0044012 A1* | 2/2017 | Casellas ................ C01B 3/0078 |

FOREIGN PATENT DOCUMENTS

| CN | 102218592 A | 10/2011 |
| CN | 102530860 A | 7/2012 |

(Continued)

*Primary Examiner* — Daniel J. Schleis
(74) *Attorney, Agent, or Firm* — Bayramoglu Law Offices LLC

(57) ABSTRACT

An adjustable deforming composite structure based on a hydrogen-induced expansion effect and a preparation method therefor are provided. The hydrogen-induced expansion effect means metals absorb hydrogen under a hydrogen-containing atmosphere and at a temperature to produce a volume expansion effect. Reactions between the metals and hydrogen are reversible reactions. When a hydrogen partial pressure is reduced or the temperature is increased, the hydrogen in the metals is removed, and the metals are restored to an original shape. Under a stimulation of external hydrogen and heat, a composite of a hydrogen-absorbing metal and other non-hydrogen-absorbing materials undergo an adjustable deformation according to a design, and a material undergoes reversible shape changes. The preparation method is applied to composite materials for a 4D printing and is used for an intelligent shape adjustment at a medium to high temperature.

8 Claims, 1 Drawing Sheet

Before hydrogen absorption

After hydrogen absorption

Hydrogen-absorbing metal A

Material B

(52) U.S. Cl.
CPC ........... *F03G 7/0613* (2021.08); *F03G 7/062* (2021.08); *B33Y 80/00* (2014.12); *F05C 2253/04* (2013.01)

(56) References Cited

FOREIGN PATENT DOCUMENTS

| | | |
|---|---|---|
| CN | 105385869 A | 3/2016 |
| CN | 106715327 A | 5/2017 |
| CN | 107074535 A | 8/2017 |
| CN | 107695509 A | 2/2018 |
| CN | 111687530 A | 9/2020 |
| JP | 2003102828 A | 4/2003 |

\* cited by examiner

ADJUSTABLE DEFORMING COMPOSITE STRUCTURE BASED ON HYDROGEN-INDUCED EXPANSION EFFECT AND PREPARATION METHOD THEREFOR

CROSS REFERENCE TO RELATED APPLICATIONS

This application is the national stage entry of International Application No. PCT/CN2020/134640, filed on Dec. 8, 2020, which is based upon and claims priority to Chinese Patent Application No. 201911282262.0 filed on Dec. 13, 2019, the entire contents of which are incorporated herein by reference.

TECHNICAL FIELD

The present disclosure relates to an adjustable deforming composite structure based on a hydrogen-induced expansion effect, a preparation method therefor, and use thereof, and belongs to the technical field of 4D printing technology.

BACKGROUND 4D printing is a technology in which an additively manufactured structure can change in shape or structure under external stimuli. During additive manufacturing, composite materials and deformable structures are directly built-in articles, so that the composite materials can be automatically assembled and configured, thereby achieving the integration of research and development, design, manufacturing, and assembly. The deformable structure involved in 4D printing technology is generally composed of a high polymer with a shape memory function or a shape-memory alloy material.

Stimuli that induce the self-assembly or deformation of a 4D printed structure generally include: thermal stimulation, water stimulation, photothermal stimulation, and the like. Most of the reported 4D printed structures are driven by high polymer deformation systems and shape-memory alloy deformation. However, the use of shape-memory alloys results in a low working temperature, a poor deformation precision, degraded memory effect after cycling, and a low deformation rate.

Hydrogen has high solid solubilities in some alloys. For example, the solid solubility of hydrogen in the $\beta$-Ti phase in a ratio of Ti/H can reach 1:1 or more. Because hydrogen atoms occupy a large number of interstitial positions of $\beta$-Ti lattices, a metal body can expand by 15% or more after absorbing hydrogen. The expansion effect can produce a very considerable strain and stress, resulting in elongation or bending of materials.

SUMMARY

Technical Problem

It was found from research that many metals and alloys can react with hydrogen under certain conditions, have the function of storing and releasing hydrogen, and are used as hydrogen storage materials. However, during a hydrogen absorption of a metal, a change in lattice parameter causes a significant volume expansion. For example, when titanium is completely converted into titanium hydride by hydrogen absorption, its volume expansion can reach up to 15%. The expansion effect caused by the hydrogen absorption of a-metal can produce a considerable strain and stress. An alloy changes in shape under the stimulation of external hydrogen and heat based on the hydrogen-induced deformation effect, then a mechanism can complete some predetermined actions and functions. This type of deformable material is also expected to meet the requirements of automatic assembly and deforming structures in various aerospace application scenarios such as aerocrafts, satellites, and space stations.

Solution to the Problem

The present disclosure provides an adjustable deforming composite structure based on a hydrogen-induced expansion effect, where a composite is composed of metal A and material B, the metal A has a hydrogen-absorbing expansion capability, and the material B does not have a hydrogen-absorbing expansion capability or has a hydrogen-absorbing expansion capability less than the hydrogen-absorbing expansion capability of the metal A under the same conditions. Preferably, a mode of occurrence of the metal A and the material B is a block or thin film.

As a preferred solution, the present disclosure provides the adjustable deforming composite structure based on a hydrogen-induced expansion effect, where the metal A includes, but is not limited to, titanium, vanadium, zirconium, hafnium, palladium, rare earth, and alloys thereof.

As a preferred solution, the present disclosure provides the adjustable deforming composite structure based on a hydrogen-induced expansion effect, where the material B is selected from at least one of carbon steel, stainless steel, copper alloy, superalloy, and refractory alloy.

As a preferred solution, the present disclosure provides the adjustable deforming composite structure based on a hydrogen-induced expansion effect, where the composite composed of the metal A and the material B is in metallurgical bonding at the joint, the metal A and the material B have certain plasticity under deforming activation with a material elongation of >2%, and there are no macro or micro cracks in the composite structure when the entire material deforms due to the expansion of the metal A. As a further preferred solution, the metal A and the material B are composited.

A deforming activation process for the adjustable deforming composite structure in the present disclosure includes the following steps.

Step 1:

Placing the composite composed of the metal A and the material B under hydrogen or hydrogen-containing gas atmosphere, and providing a temperature for the hydrogen-absorbing metal A to absorb hydrogen, so that the hydrogen-absorbing metal A expands, causing deformation to the entire composite, the deformation of the composite including, but not limited to, elongation, bending, or twisting, to obtain a deformed composite.

Step 2 is required for an object that needs to be restored to an original shape after the deformation in step 1 is completed.

Step 2:

Placing the deformed composite obtained in step 1 under a gas atmosphere that does not contain hydrogen or has a low hydrogen content, and providing a temperature for the hydrogen-absorbing metal A to release hydrogen, so that the hydrogen-absorbing metal A shrinks, causing the entire composite to be restored to the original shape.

In the present disclosure, a deformation amount of the composite is controlled by controlling a hydrogen absorption amount of the hydrogen-absorbing metal A by adjusting the hydrogen content, hydrogen concentration, or hydrogen partial pressure under the atmosphere, or the temperature during the deformation of the adjustable deforming composite structure, and the hydrogen content, the hydrogen concentration, the hydrogen partial pressure, or the temperature is determined by physical and chemical properties of the hydrogen-absorbing metal A used.

In the present disclosure, the deformed composite can be directly used under some specific atmospheres.

The present disclosure provides a method for preparing the adjustable deforming composite structure based on a hydrogen-induced expansion effect, including: preparing the composite structure by a conventional metal preparation and processing method, the conventional metal preparation and processing method including, but not limited to, at least one of rolling, forging, extrusion, diffusion welding, friction welding, and explosive cladding; or preparing the composite structure by a metal thin film preparation method, the metal thin film preparation method including, but not limited to, at least one of chemical vapor deposition, physical vapor deposition, and electroplating; or preparing the composite structure by additive manufacturing technology, the additive manufacturing technology including, but not limited to, at least one of powder-bed laser printing, electron beam selective melting, powder feeding laser or electron beam printing, electron beam freeform fabrication, binder jetting 3D printing, and powder stereolithography.

As a preferred solution, the present disclosure provides the method for preparing the adjustable deforming composite structure based on a hydrogen-induced expansion effect, further including: additive manufacturing under a hydrogen-containing atmosphere with the material B as a base to obtain the hydrogen-containing composite structure;

or using hydrogen absorption on the metal A as a base, and then additive manufacturing metal A on the base under a hydrogen-containing atmosphere, to obtain the hydrogen-containing composite structure;

or preparing a thin film of the metal A on the material B as a base under a hydrogen-containing atmosphere to obtain the hydrogen-containing composite structure;

or using hydrogen absorption on the metal A as a base, and then preparing a thin film material B on metal A under a hydrogen-containing atmosphere, to obtain the hydrogen-containing composite structure.

As a preferred solution, the present disclosure provides the method for preparing the adjustable deforming n composite structure based on a hydrogen-induced expansion effect, where the deformation may be implemented by placing the hydrogen-containing composite structure under a gas atmosphere that does not contain hydrogen or has a low hydrogen content, and providing a temperature for the hydrogen-absorbing metal A to release hydrogen, so that the hydrogen-absorbing metal A shrinks, causing the deformation to the entire composite, the deformation of the composite including, but not limited to, elongation, bending, or twisting, to obtain a deformed composite.

The repetition of the restoration-deformation process of the deformed composite is controlled by hydrogen absorption and release.

The present disclosure provides the use of the adjustable deforming composite structure based on a hydrogen-induced expansion effect, including at least one of the fields of sealing, fastening, press and release, robots, and intelligent deformable structures.

The present disclosure provides use of the adjustable deforming composite structure based on a hydrogen-induced expansion effect.

The adjustable deforming composite structure based on a hydrogen-induced expansion effect is used in preparing porous and/or dense film materials; or 4D printing can be implemented by additive manufacturing the composite structure on the base under a hydrogen atmosphere;

or 4D printing can be implemented by using hydrogen absorption on the composite structure as a base and then additive manufacturing under a hydrogen desorption atmosphere.

For use in industry, a 4D printed product can be obtained by additive manufacturing the composite structure on the base under a hydrogen atmosphere and then performing hydrogen desorption under a hydrogen desorption atmosphere after completing the printing.

For use in industry, a 4D printed product can be obtained by using hydrogen absorption on the composite structure as a base, additive manufacturing under a hydrogen desorption atmosphere, and then performing hydrogen absorption under a hydrogen-absorbing atmosphere after completing the printing.

In the present disclosure, the metal A and the material B are designed for the composite to be bent and deformed under a hydrogen atmosphere, so that porous and dense film materials with the same material or different materials can be prepared at the same time during bending and deformation.

For example, a slurry for preparing a porous film material is coated on an expanded surface of the composite structure during bending, a slurry for preparing a dense film material is coated on an expanded surface of the composite structure during bending, a slurry is then coated on the composite structure, and then the composite structure coated with the slurry is placed under a hydrogen atmosphere and dried, to obtain a dense and porous film.

Beneficial Effects

Principles and Advantages

According to the principle of hydrogen-induced deformation, the composite structure in the present disclosure as an adjustable deforming material has the following advantages.

(1) High deformation precision and adjustable. The expansion strain of a material is linearly dependent with a hydrogen absorption amount. The hydrogen absorption amount can be controlled by coordinately adjusting external hydrogen (hydrogen partial pressure) and thermal (temperature) stimuli. Different from a phase transition deformation mechanism of shape-memory alloys, the advantage of hydrogen-induced deformation is that the material can reach a predetermined deformation amount by adjusting the hydrogen partial pressure in a wide temperature range.

(2) Good reversibility. The metal-hydrogen reaction has good reversibility and low temperature hysteresis. In theory, the repeated deformation-restoration cycle of the material can reach hundreds to thousands of times.

High temperature resistance and good high-temperature strength. The metal-hydrogen reaction is carried out at 400-800° C. Titanium alloys are very mature in aerospace applications as high-temperature and high-strength structural parts. Hydrogen-induced deformation can be used to all alloy materials in principle. A composite structure material may be a high-strength steel, a superalloy, or the like.

DETAILED DESCRIPTION OF THE EMBODIMENTS

The following further describes the present disclosure in detail with reference to examples.

In the present disclosure, there is no cracking and peeling off on a composite of metal A and material B during heating.

Example 1

1. A 316L stainless steel plate with a thickness of 10 mm was used as a 3D laser printing base.

Figure 1:
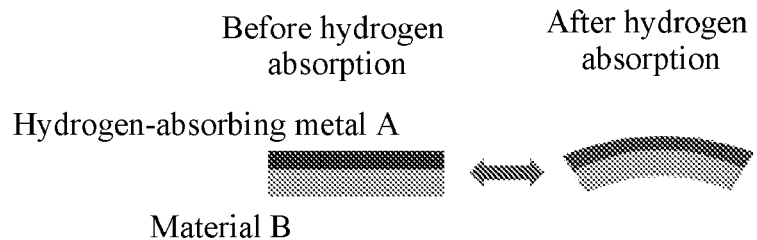
FIG. 1 is a schematic diagram of a working principle according to the present disclosure.
Figure 2:
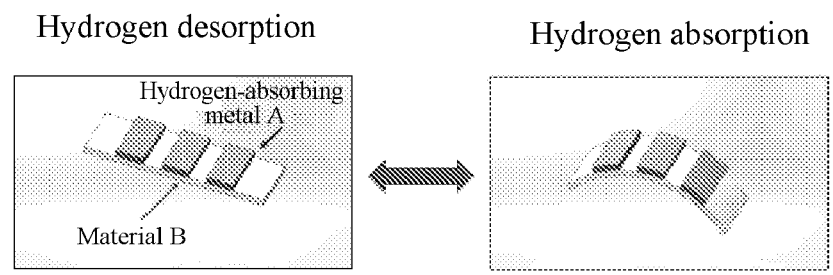
FIG. 2 is a schematic diagram of deformation/restoration of a two-dimensional deformable adjustable composite structure designed by the present disclosure.

2. A titanium alloy powder (composition: Ti-6A1-4V) with an average particle size less than 75 μm was put into a powder feeding barrel of a 3D laser printer, a distance between a laser transmitter and the base was adjusted, a program was loaded for printing according to the shape shown in FIG. 2, and then the printed product was cooled.

3. A composite of the titanium alloy and the stainless steel plate was obtained and then annealed.

4. The machined composite was placed in a hydrogen furnace to be heated to 650° C. in a vacuum, a hydrogen gas was introduced at normal pressure, the hydrogen gas and the heat were kept for 2 h, and then the furnace was shut down for cooling.

5. The composite with both the titanium alloy and the stainless steel significantly bent and deformed was taken out of the hydrogen furnace.

6. The composite with the titanium alloy and the stainless steel significantly bent and deformed was placed in a vacuum furnace and vacuumized (a vacuum level is less than $10^{-3}$ Pa), the temperature was increased to 750° C. to be kept for 5 h, and the furnace was shut down for cooling.

7. The composite with both the titanium alloy and the stainless steel restored to an original shape was taken out of the vacuum furnace.

Comparative Example 1

The conditions were the same as in Example 1 except that an argon gas was introduced instead of the hydrogen gas in the step (4). The obtained composite of the titanium alloy and the stainless steel was not bent and deformed.

Example 2

1. An Inconel718 superalloy with a thickness of 10 mm was used as a 3D electron beam printing base.

Figure 3:
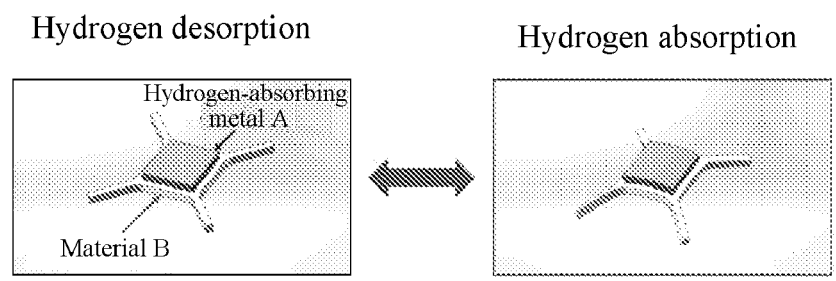
FIG. 3 is a schematic diagram of deformation/restoration of a three-dimensional deformable adjustable composite structure designed by the present disclosure.

2. A titanium alloy powder (composition: Ti-6A1-4V) with an average particle size less than 100 μm was put into a powder feeder of a 3D electron beam printer, the powder was preheated, electron beam printing wad performed on the superalloy with the powder according to the shape shown in FIG. 3, and then the printed product was cooled.

3. A composite structure of the titanium alloy and the superalloy was obtained.

4. The machined composite was placed in a hydrogen furnace to be heated to 650° C. in a vacuum, a hydrogen gas (the pressure of the hydrogen gas was 1 bar) was introduced, the hydrogen gas and the heat were kept for 2 h, and then the furnace was shut down for cooling.

5. The composite with both the titanium alloy and the superalloy significantly bent and deformed was taken out of the hydrogen furnace.

6. The composite with the titanium alloy and the superalloy significantly bent and deformed was placed in a vacuum furnace and vacuumized (a vacuum level is less than $10^{-3}$ Pa), the temperature was increased to 750° C. to be kept for 4 h, and the furnace was shut down for cooling.

7. The composite with both the titanium alloy and the superalloy restored to an original shape was taken out of the vacuum furnace.

Comparative Example 2

The conditions were the same as in Example 2 except that an argon gas was introduced instead of the hydrogen gas in the step (4). The obtained composite of the titanium alloy and the superalloy was not bent and deformed.

Example 3

1. A double-layer composite plate of pure titanium and low-carbon steel was machined to form a composite with the shape shown in FIG. 2.

2. The machined composite was placed in a hydrogen furnace to be heated to 650° C. in a vacuum, a pure hydrogen gas was introduced at normal pressure, the hydrogen gas and the heat were kept for 1 h, and then the furnace was shut down for cooling.

3. The composite with both the titanium and low-carbon steel layers significantly bent and deformed was taken out of the hydrogen furnace.

4. The composite with the titanium and the low-carbon steel significantly bent and deformed was placed in a vacuum furnace and vacuumized (a vacuum level is less than $10^{-3}$ Pa), the temperature was increased to 750° C. to be kept for 2 h, and the furnace was shut down for cooling.

5. The composite with both the titanium and the low-carbon steel restored to an original shape was taken out of the vacuum furnace.

Comparative Example 3

The conditions were the same as in Example 3 except that an argon gas was introduced instead of the hydrogen gas in the step (2). The obtained composite of the titanium and the low-carbon steel was not bent and deformed.

Example 4

1. A double-layer composite plate of TC4 titanium alloy and 316L stainless steel was machined to form a composite with the shape shown in FIG. 3.

2. The machined composite was placed in a hydrogen furnace to be heated to 700° C. in a vacuum, a hydrogen gas (the pressure of the hydrogen gas was 1 bar) was introduced, the hydrogen gas and the heat were kept for 1 h, and then the furnace was shut down for cooling.

3. The composite with both the TC4 titanium alloy and the 316L stainless steel significantly bent and deformed was taken out of the hydrogen furnace.

4. The composite with the TC4 titanium alloy and the 316L stainless steel significantly bent and deformed was placed in a vacuum furnace and vacuumized (a vacuum level is less than $10^{-3}$ Pa), the temperature was increased to 800° C. to be kept for 3 h, and the furnace was shut down for cooling.

5. The composite with both the TC4 titanium alloy and the 316L stainless steel restored to an original shape was taken out of the vacuum furnace.

Comparative Example 4

The conditions were the same as in Example 4 except that an argon gas was introduced instead of the hydrogen gas in the step (2). The obtained composite of the TC4 titanium alloy and the 316L stainless steel was not bent and deformed.

Example 5

1. A double-layer composite plate of zirconium and copper metals was machined to form a composite with the shape shown in FIG. 3.

2. The machined composite was placed in a hydrogen furnace to be heated to 800° C. in a vacuum, a hydrogen gas (the pressure of the hydrogen gas was 1 bar) was introduced, the hydrogen gas and the heat were kept for 4 h, and then the furnace was shut down for cooling.

3. The composite with both the zirconium and the copper significantly bent and deformed was taken out of the hydrogen furnace.

4. The composite with the zirconium and the copper significantly bent and deformed was placed in a vacuum furnace and vacuumized (a vacuum level is less than $10^{-3}$ Pa), the temperature was increased to 750° C. to be kept for 10 h, and the furnace was shut down for cooling.

5. The composite with both the zirconium and the copper restored to an original shape was taken out of the vacuum furnace.

Comparative Example 5

The conditions were the same as in Example 5 except that vacuum was kept with no hydrogen gas introduced in the step (2). The obtained composite of the zirconium and the copper was not bent and deformed.

Example 6

1. A 316L stainless steel plate with a thickness of 10 mm was used as a 3D laser printing base. 2. A titanium alloy powder (composition: Ti-6A1-4V) with an average particle size less than 75 μm was put into a powder feeding barrel of a 3D laser printer, a hydrogen-argon mixed gas containing 5% of hydrogen was introduced, a distance between a laser transmitter and the base was adjusted, a program was loaded for printing according to the shape shown in FIG. 2, and then the printed product was cooled.

3. A composite of the titanium alloy and the stainless steel plate was obtained and then annealed at 750° C. in a vacuum.

4. The composite with both the titanium alloy and the stainless steel significantly bent and deformed was taken out of a vacuum furnace.

Comparative Example 6

The conditions were the same as in Example 6 except that an argon gas was introduced instead of the hydrogen gas in the step (2). The obtained composite of the titanium alloy and the stainless steel was not bent and deformed.

Example 7

1. A 316L stainless steel plate with a thickness of 0.1 mm was used as a base.

2. A 0.2 mm titanium film was deposited on the stainless steel base with 99.99% of a titanium material as a target by using a magnetron sputtering technology, and then was cooled under a hydrogen atmosphere.

3. A composite of the titanium alloy and the stainless steel plate was obtained and then annealed at 750° C. in a vacuum.

4. The composite with both the titanium alloy and the stainless steel significantly bent and deformed was taken out of a vacuum furnace.

Comparative Example 7

The conditions were the same as in Example 7 except that an argon gas was introduced instead of the hydrogen gas in the step (2). The obtained composite of the titanium alloy and the stainless steel was not bent and deformed.

What is claimed is:

1. A method for preparing an adjustable deforming composite structure based on a hydrogen-induced expansion effect, wherein a composite is composed of a metal and a material, the metal has a hydrogen-absorbing expansion capability, and the material does not have the hydrogen-absorbing expansion capability or has a hydrogen-absorbing expansion capability less than the hydrogen-absorbing expansion capability of the metal under identical conditions, comprising:

preparing the adjustable deforming composite structure by a conventional metal preparation and processing method, the conventional metal preparation and processing method comprising at least one of rolling, forging, extrusion, diffusion welding, friction welding, and explosive cladding; or preparing the adjustable deforming composite structure by a metal thin film preparation method, the metal thin film preparation method comprising at least one of chemical vapor deposition, physical vapor deposition, and electroplating; or preparing the adjustable deforming composite structure by an additive manufacturing method, the additive manufacturing technology comprising at least one of powder-bed laser printing, electron beam selective melting, powder feeding laser or electron beam printing, electron beam freeform fabrication, binder jetting 3D printing, and powder stereolithography, and further comprising:

additive manufacturing the material on a base under a hydrogen-containing atmosphere to obtain a hydrogen-containing composite structure;

or using a hydrogen absorption on the metal as the base, and then additive manufacturing metal on the base under the hydrogen-containing atmosphere, to obtain the hydrogen-containing composite structure;

or preparing a thin film of the metal on the material as the base under the hydrogen-containing atmosphere to obtain the hydrogen-containing composite structure;

or using the hydrogen absorption on the metal as the base, and then preparing the thin film of the material under the hydrogen-containing atmosphere, to obtain the hydrogen-containing composite structure.

2. The method according to claim 1, wherein a deformation is implemented by:
  placing the hydrogen-containing composite structure under a gas atmosphere without hydrogen or has a low hydrogen content, and providing a temperature for the metal to release hydrogen, to shrink the metal, wherein the metal is a hydrogen absorbing metal, causing the deformation to a whole of the composite to obtain a deformed composite, wherein the deformation of the composite comprises elongation, bending, and twisting; and
  a repetition of a restoration-deformation process of the deformed composite is controlled by the hydrogen absorption and release.

3. The method according to claim 1, wherein the metal comprises titanium, vanadium, zirconium, hafnium, palladium, rare earth, and alloys of the titanium, the vanadium, the zirconium, the hafnium, the palladium, and the rare earth.

4. The method according to claim 1, wherein the material comprises at least one of carbon steel, alloy steel, stainless steel, copper alloy, titanium-aluminum alloy, superalloy, and refractory alloy.

5. A method for preparing an adjustable deforming composite structure based on a hydrogen-induced expansion effect, wherein a composite is composed of a metal and a material, the metal has a hydrogen-absorbing expansion capability, and the material does not have the hydrogen-absorbing expansion capability or has a hydrogen-absorbing expansion capability less than the hydrogen-absorbing expansion capability of the metal under identical conditions, comprising:
  preparing the adjustable deforming composite structure by a conventional metal preparation and processing method, the conventional metal preparation and processing method comprising at least one of rolling, forging, extrusion, diffusion welding, friction welding, and explosive cladding; or
  preparing the adjustable deforming composite structure by a metal thin film preparation method, the metal thin film preparation method comprising at least one of chemical vapor deposition, physical vapor deposition, and electroplating; or
  preparing the adjustable deforming composite structure by an additive manufacturing method, the additive manufacturing technology comprising at least one of powder-bed laser printing, electron beam selective melting, powder feeding laser or electron beam printing, electron beam freeform fabrication, binder jetting 3D printing, and powder stereolithography, wherein the composite composed of the metal and the material is in a metallurgical bonding at a joint, the metal and the material have a plasticity under a deforming activation with a material elongation of >2%, and there are no macro or micro cracks in the adjustable deforming composite structure when an entire material deforms due to an expansion of the metal.

6. The method according to claim 5, wherein a deformation is implemented by:
  placing the hydrogen-containing composite structure under a gas atmosphere without hydrogen or has a low hydrogen content, and providing a temperature for the metal to release hydrogen, to shrink the metal, wherein the metal is a hydrogen absorbing metal, causing the deformation to a whole of the composite to obtain a deformed composite, wherein the deformation of the composite comprises elongation, bending, and twisting; and
  a repetition of a restoration-deformation process of the deformed composite is controlled by the hydrogen absorption and release.

7. The method according to claim 5, wherein the metal comprises titanium, vanadium, zirconium, hafnium, palladium, rare earth, and alloys of the titanium, the vanadium, the zirconium, the hafnium, the palladium, and the rare earth.

8. The method according to claim 5, wherein the material comprises at least one of carbon steel, alloy steel, stainless steel, copper alloy, titanium-aluminum alloy, superalloy, and refractory alloy.

\* \* \* \* \*